United States Patent
Wang

(10) Patent No.: US 8,391,148 B1
(45) Date of Patent: Mar. 5, 2013

(54) METHOD AND APPARATUS FOR ETHERNET DATA COMPRESSION

(75) Inventor: Phil Yonghui Wang, Nepean (CA)

(73) Assignee: Rockstar Consortium USLP, New York, NY (US)

( * ) Notice: Subject to any disclaimer, the term of this patent is extended or adjusted under 35 U.S.C. 154(b) by 185 days.

(21) Appl. No.: 12/182,968

(22) Filed: Jul. 30, 2008

Related U.S. Application Data

(60) Provisional application No. 60/952,733, filed on Jul. 30, 2007.

(51) Int. Cl.
| | |
|---|---|
| G01R 31/08 | (2006.01) |
| G06F 11/00 | (2006.01) |
| G08C 15/00 | (2006.01) |
| H04J 1/16 | (2006.01) |
| H04J 3/14 | (2006.01) |
| H04L 1/00 | (2006.01) |
| H04L 12/26 | (2006.01) |

(52) U.S. Cl. ............ 370/235; 370/236; 370/236.2; 370/389

(58) Field of Classification Search .............. None
See application file for complete search history.

(56) References Cited

U.S. PATENT DOCUMENTS

| 5,298,895 | A * | 3/1994 | Van Maren ............... 341/51 |
|---|---|---|---|
| 5,373,290 | A * | 12/1994 | Lempel et al. ............ 341/51 |
| 5,389,922 | A * | 2/1995 | Seroussi et al. ........... 341/51 |
| 5,953,503 | A * | 9/1999 | Mitzenmacher et al. .... 709/203 |
| 5,991,713 | A * | 11/1999 | Unger et al. ............. 704/9 |
| 6,121,903 | A * | 9/2000 | Kalkstein ............... 341/63 |
| 6,226,748 | B1 * | 5/2001 | Bots et al. .............. 726/15 |
| 6,414,610 | B1 * | 7/2002 | Smith .................. 341/106 |
| 6,434,561 | B1 * | 8/2002 | Durst et al. .............. 1/1 |
| 6,560,368 | B1 * | 5/2003 | Brown et al. ............ 382/239 |
| 6,618,397 | B1 * | 9/2003 | Huang .................. 370/474 |
| 6,650,662 | B1 * | 11/2003 | Arnaud et al. ........... 370/526 |
| 7,010,727 | B1 * | 3/2006 | Stucker ................ 714/52 |
| 7,027,450 | B2 * | 4/2006 | Collette et al. .......... 370/401 |
| 7,068,599 | B1 * | 6/2006 | Jiang et al. ........... 370/230.1 |
| 7,111,142 | B2 * | 9/2006 | Spencer et al. .......... 711/170 |
| 7,298,298 | B1 * | 11/2007 | Garakani ............... 341/87 |
| 7,359,974 | B1 * | 4/2008 | Quinn et al. ........... 709/228 |
| 7,426,636 | B1 * | 9/2008 | McGrew et al. .......... 713/160 |
| 2002/0136224 | A1 * | 9/2002 | Motley ................. 370/401 |
| 2003/0018647 | A1 * | 1/2003 | Bialkowski ............ 707/101 |
| 2003/0030575 | A1 * | 2/2003 | Frachtenberg et al. ..... 341/51 |
| 2004/0008650 | A1 * | 1/2004 | Le et al. ............... 370/338 |
| 2004/0090989 | A1 * | 5/2004 | Kobayashi ............. 370/469 |
| 2004/0103215 | A1 * | 5/2004 | Ernst et al. ........... 709/247 |
| 2004/0170166 | A1 * | 9/2004 | Cohen ................. 370/389 |
| 2004/0184408 | A1 * | 9/2004 | Liu et al. .............. 370/236 |
| 2004/0199660 | A1 * | 10/2004 | Liu ................... 709/236 |
| 2005/0114120 | A1 * | 5/2005 | Bhaskaran ............. 704/220 |

(Continued)

*Primary Examiner* — Ayaz Sheikh
*Assistant Examiner* — Peter Chau
(74) *Attorney, Agent, or Firm* — Anderson Gorecki & Roville, LLP

(57) ABSTRACT

A method and apparatus for Ethernet data compression enables the size of Ethernet frames to be reduced. Compression and decompression of Ethernet frames occur by the Ethernet network elements, rather than by user computers or end devices that transmit data on the Ethernet network. A new EtherType value may be used to identify the type of compressed Ethernet frames and optionally the type of mechanism used to compress the payload of Ethernet frames. The new EtherType may be inserted into a newly assembled frame ahead of the original EtherType. Alternatively, the new EtherType may replace the original EtherType and a short sub-header may be used to identify the original EtherType. Out-of-band network signaling by the Ethernet control plane may also be used to determine whether frames are to be compressed and decompressed over controlled Ethernet links and tunnels, with or without use of the new EtherType.

15 Claims, 4 Drawing Sheets

U.S. PATENT DOCUMENTS

| | | | |
|---|---|---|---|
| 2005/0187777 A1* | 8/2005 | Chevallier et al. | 704/500 |
| 2005/0271033 A1* | 12/2005 | Nakash | 370/349 |
| 2005/0271066 A1* | 12/2005 | Valadarsky | 370/401 |
| 2006/0085737 A1* | 4/2006 | Liu | 715/513 |
| 2006/0235992 A1* | 10/2006 | Matias et al. | 709/236 |
| 2006/0285501 A1* | 12/2006 | Damm | 370/252 |
| 2007/0016903 A1* | 1/2007 | Maeomichi et al. | 717/177 |
| 2007/0147426 A1* | 6/2007 | Sharma et al. | 370/469 |
| 2007/0205925 A1* | 9/2007 | Foster | 341/51 |
| 2008/0120315 A1* | 5/2008 | Ionescu et al. | 707/101 |
| 2010/0002628 A1* | 1/2010 | Anchi et al. | 370/328 |
| 2010/0103953 A1* | 4/2010 | Matias et al. | 370/477 |

* cited by examiner (802.3 frame format)

(802.1 frame format)

(In combination)

(EthComp – normal EtherType)

(EthComp – compact EtherType)

METHOD AND APPARATUS FOR ETHERNET DATA COMPRESSION

CROSS-REFERENCE TO RELATED APPLICATIONS

This application claims priority to U.S. Provisional Patent Application No. 60/952,733 filed Jul. 30, 2007, entitled ETHERNET DATA COMPRESSION AND DECOMPRESSION, the content of which is hereby incorporated herein by reference.

BACKGROUND

Data communication networks may include various routers, switches, bridges, and other network devices, coupled to and configured to pass data to one another. These devices will be referred to herein as "network elements." Data is communicated through the data communication network by passing protocol data units, such as Internet Protocol packets, Ethernet Frames, data cells, segments, or other logical associations of bits/bytes of data, between the network elements by utilizing one or more communication links between the network elements. A particular protocol data unit may be handled by multiple network elements and cross multiple communication links as it travels between its source and its destination over the network.

The various network elements on the communication network communicate with each other using predefined sets of rules, referred to herein as protocols. Different protocols are used to govern different aspects of the communication, such as how signals should be formed for transmission between network elements, various aspects of what the protocol data units should look like, how protocol data units should be handled or routed through the network by the network elements, and how information such as routing information should be exchanged between the network elements.

One commonly implemented networking protocol is referred to as Ethernet. The Ethernet protocol has been defined by the Institute of Electrical and Electronics Engineers (IEEE). A first family of protocols (IEEE 802.3) defines Ethernet for local area networks, while another family of protocols (IEEE 802.1) defines Ethernet for use in wide area networks such as carrier networks.

As networks grow and the amount of traffic on the networks increases, congestion is inevitable where bandwidth supply is less than demand. For example, both IEEE standards groups (802.1 and 802.3) have working committees focused on congestion in Ethernet networks. One way to alleviate congestion is to add capacity to the network. This is a viable long-term solution for networks where it is easy to add capacity, such as in local area networks. There are particular networks, however, where it is difficult to add bandwidth, such as in wide area networks, metropolitan area networks, and wireless networks. Additionally, although it is relatively easier to add capacity to a local area network, doing so may take a finite amount of time and resources and, accordingly, even these types of networks may experience congestion. Other networking technologies, such as many of the technologies used to implement access networks to connect subscribers to service providers, are often inherently slow. Where the underlying technology is only capable of limited bandwidth throughput, congestion is likely to occur and difficult to alleviate. Accordingly, it would be advantageous to provide a way to improve bandwidth efficiency and therefore reduce congestion in an Ethernet network.

SUMMARY

A method and apparatus for Ethernet data compression enables the size of the Ethernet frames to be reduced. According to one embodiment of the invention, compressed Ethernet frames may be tagged so that they may be identified by the data plane as containing a compressed payload. Compression of the Ethernet frames without data loss occurs by the Ethernet nodes on the Ethernet network, rather than by the computers or end stations that use the Ethernet network to transmit data. Thus, since compression is occurring at the Ethernet layer (Layer 2) rather than at the application layer, the compression is transparent to applications using the network. The frames are also decompressed at the Ethernet layer to restore the original frames before exiting the Ethernet network.

In one embodiment, a new EtherType is used to identify compressed Ethernet frames and optionally the type of compression algorithm used to compress the payload of the Ethernet frames. The new EtherType may have the form of a standard 2 byte EtherType and have a value assigned by the IEEE. To be compatible with the current Ethernet protocol implementations, the new EtherType may be inserted into the frame ahead of the original EtherType value. Alternatively, the new EtherType may replace the original EtherType and a short subheader, such as a four bit field can be added after the new EtherType to identify the original EtherType.

In another embodiment, out-of-band signaling is used to establish which frames are compressed, with or without use of the new EtherType. The out of band signaling may be implemented over a control Ethernet link or tunnel controlled under the network control plane using Ethernet OAM or another mechanism. Optionally, network congestion indicators may be used by the control plane to determine whether Ethernet frames are to be compressed.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures.

DETAILED DESCRIPTION

The following detailed description sets forth numerous specific details to provide a thorough understanding of the invention. However, those skilled in the art will appreciate that the invention may be practiced without these specific details. In other instances, well-known methods, procedures, components, protocols, algorithms, and circuits have not been described in detail so as not to obscure the invention.

Figure 1:
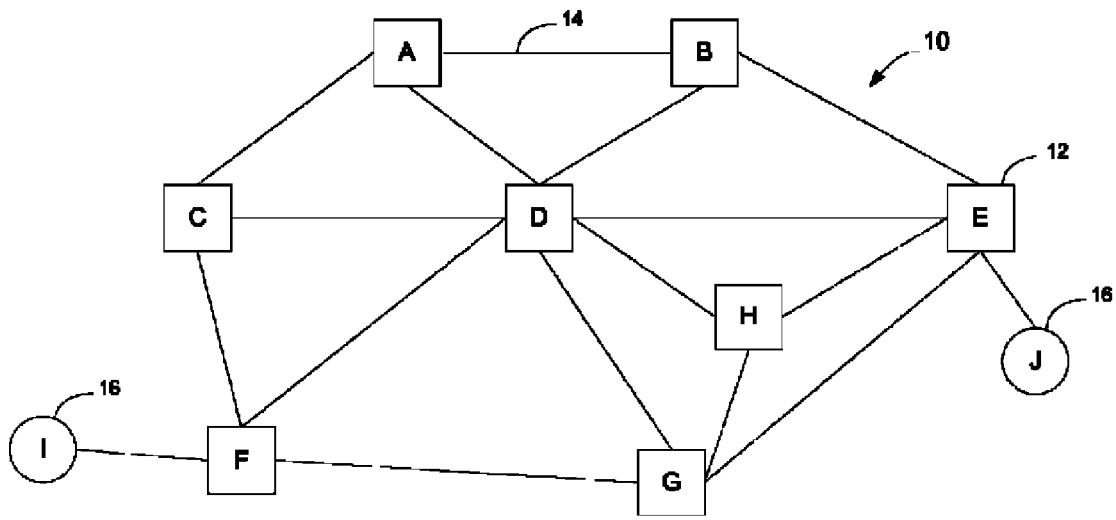
FIG. 1 is a functional block diagram of an example Ethernet network.

FIG. 1 is a functional block diagram of an example Ethernet network 10. As shown in FIG. 1, the network 10 in this example includes a plurality of network elements 12 interconnected by links 14. Clients I, J can be a user computer or end device, and communicate each other through the network. Network elements E and F are Ethernet switches at edge and connect clients I and J to the network. Network elements A, B, C also provide network access, and can be Ethernet or other network edge devices. Other network elements D, G, H are backbone and core network devices, which can be Ethernet switches, IP routers, or other network elements. Network subscribers 16 may transmit data over the network 10 by causing the network elements 12 to forward data on the links 14.

Figure 2:
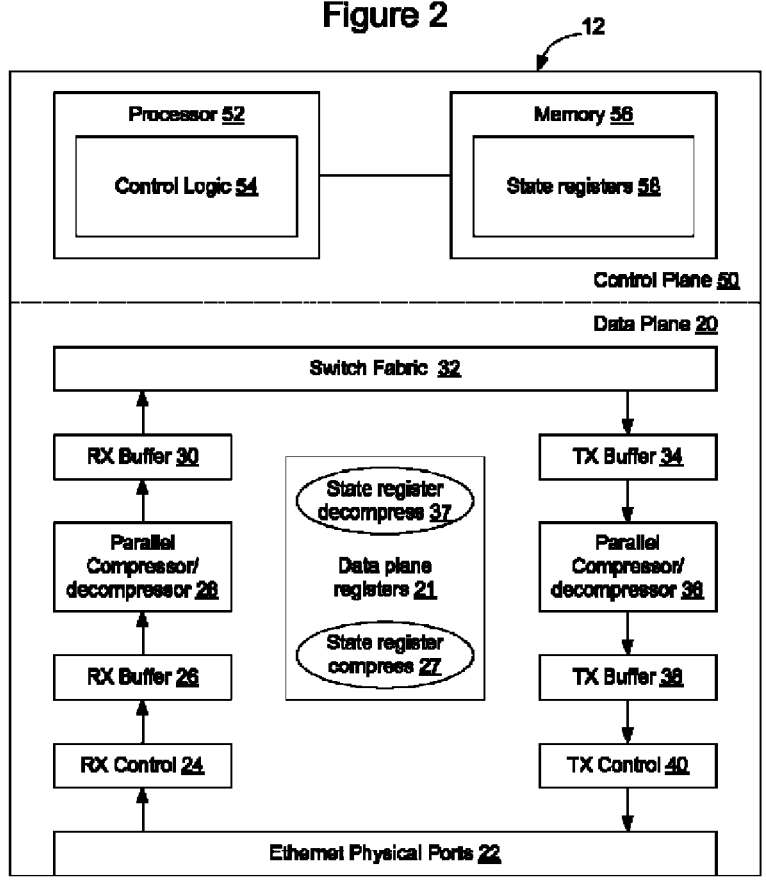
FIG. 2 is a functional block diagram of an example network element that may operate on the Ethernet network of FIG. 1.

FIG. 2 illustrates an example of a network element such as an Ethernet switch, which may be used to implement an embodiment of the invention. As shown in FIG. 2, the network element includes a data plane 20 and a control plane 50. The data plane 20 generally includes hardware configured to process Ethernet frames and a set of registers 21 set by the control plane that control operations of the data plane. In the example network element shown in FIG. 2, the data plane 20 includes physical ports 22 that receive and transmit the Ethernet frames. The ingress Ethernet frames are received to a first RX buffer 26. An RX control 24 reads the header of the Ethernet frame and checks the compress state register 27 to determine whether the Ethernet frame is to be compressed. The compress state registers 27 may indicate that particular flows of Ethernet frames are to be compressed or may indicate that all Ethernet frames are to be compressed. Although the example shown in FIG. 2 has separate compress and decompress registers, a single register may optionally be used to control both processes depending on the implementation.

If the Ethernet frame is to be compressed, it will be passed from the RX buffer 26 to parallel compressors 28 to be compressed and then stored to an RX buffer 30. The compressed Ethernet frame in the RX buffer 30 will then be input to a switch fabric 32 to switch the frame within the Ethernet node.

On the egress from the switch fabric, the Ethernet frame will be transmitted to a first Transmit (TX) buffer 34. A transmit control 40 will check decompress state registers 37 to determine if the Ethernet frame should be decompressed. The decompress state registers 37 may identify particular flows of Ethernet frames to be compressed or may identify all Ethernet frames to be compressed.

If the Ethernet frame is to be decompressed, it will be passed from the TX buffer 34 to parallel decompressors 36 to be decompressed and then stored to a TX buffer 38. The decompressed frame will then be passed to the physical ports 22 for transmission on the Ethernet network. FIG. 2 shows an embodiment in which compression is performed on ingress Ethernet frames, and decompression is on egress Ethernet frames. The compression or decompression of Ethernet frames may happen at ingress, egress, or both.

Figure 3:
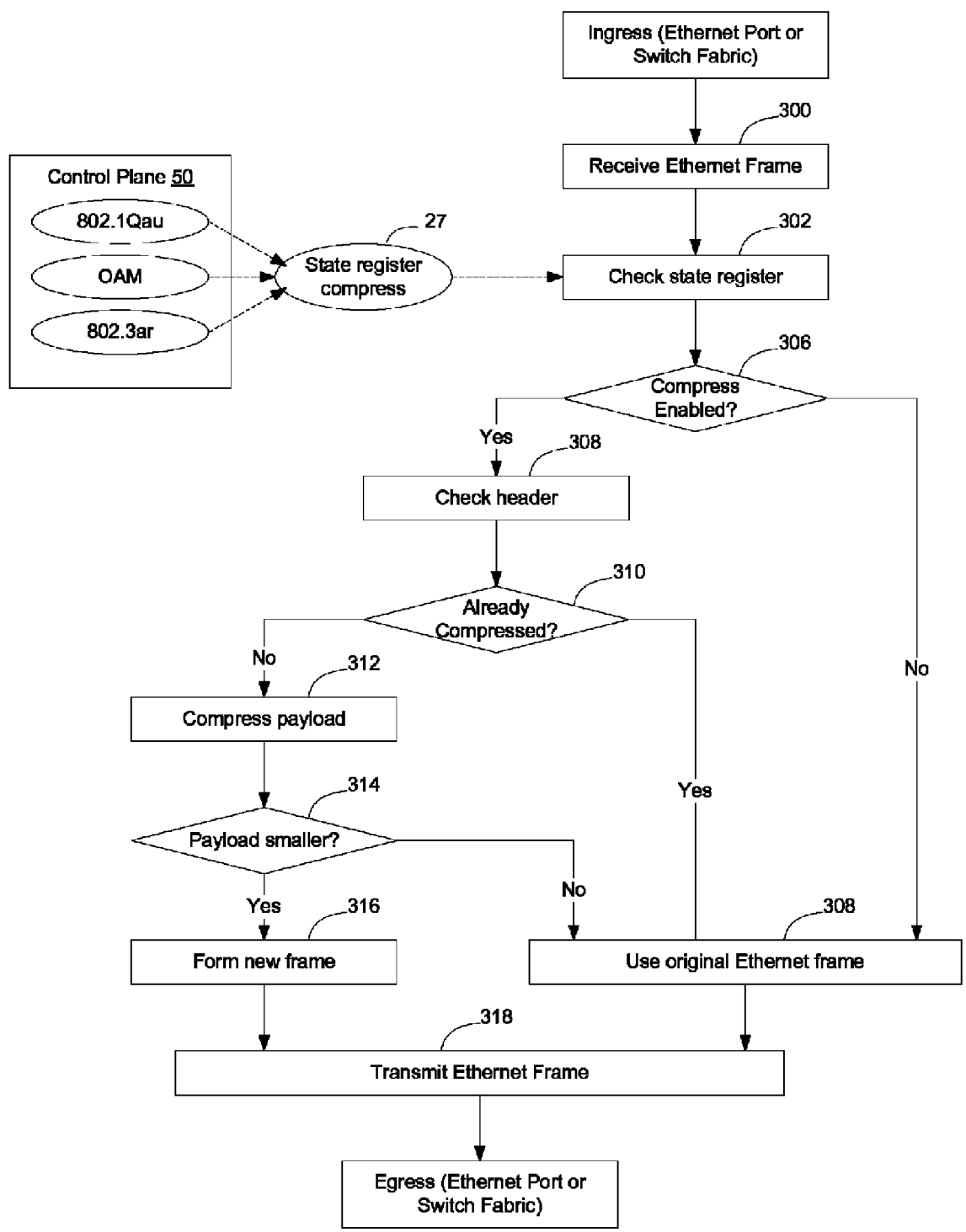
FIG. 3 is a flow chart illustrating a compression process according to an embodiment of the invention.
Figure 4:
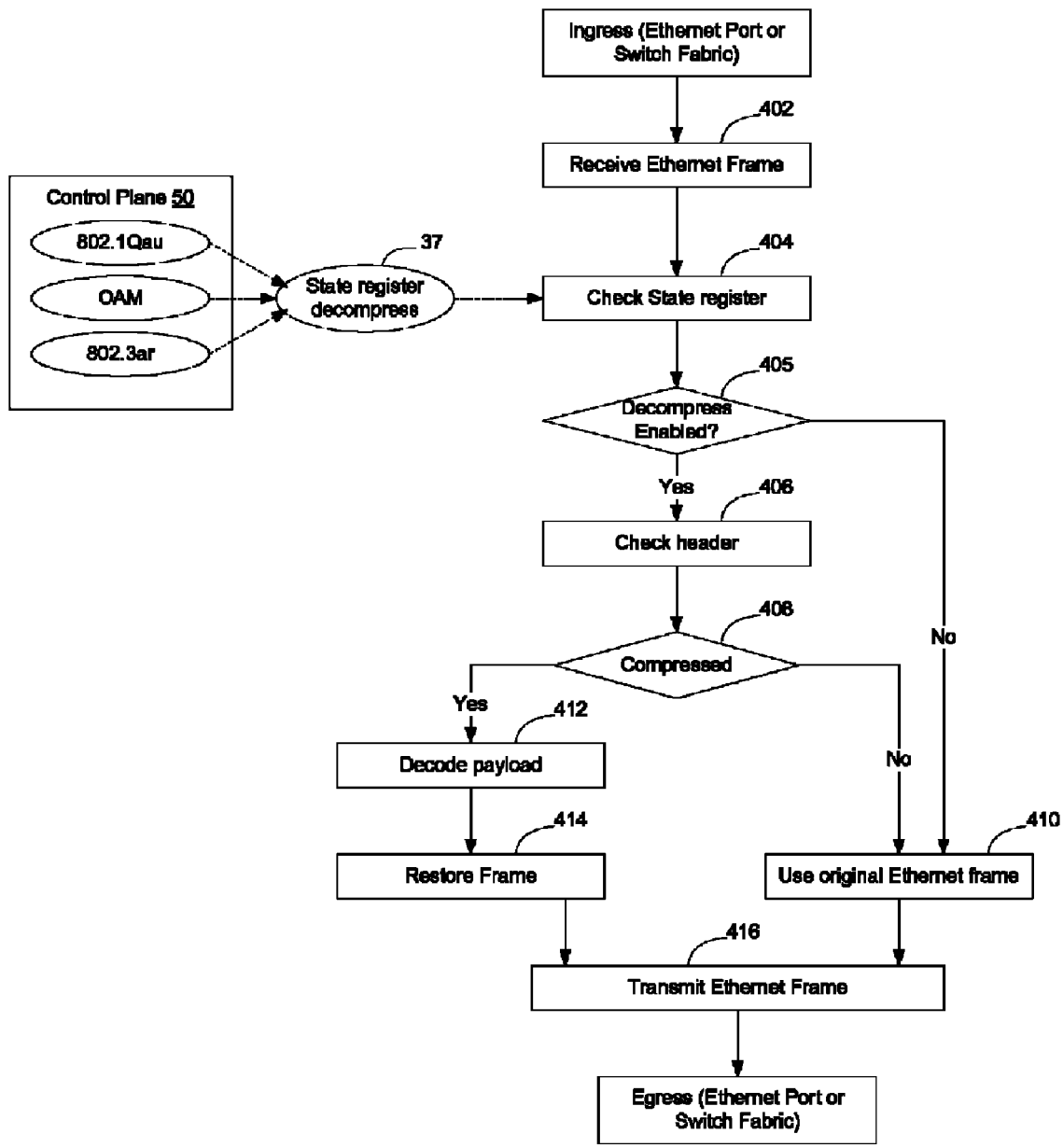
FIG. 4 is a flow chart illustrating a decompression process according to an embodiment of the invention.

The control plane 50 of the network element 12 contains a processor 52 containing control logic 54 configured to control operations of the data plane in the network element 12 on the network 10. Data and instructions associated with programs that enable the Ethernet node to control the data plane to implement the Ethernet compression/decompression processes described herein may be stored as one or more computer programs in memory 56. The network element 12 may contain other software, processes, and stores of information to enable it to perform the functions described herein related to Ethernet payload compression and to perform other functions commonly implemented in a network element on a communication network such as the communication network of FIG. 1. For example, the control plane may maintain state registers 58 that are programmed into the data plane to control whether the data plane compresses and decompresses particular Ethernet flows or all Ethernet frames. As shown in FIGS. 3 and 4, the control plane may participate in detecting congestion on the network using 802.1Qau, 802.3ar, and may participate in Ethernet OAM signaling to enable control plane signaling (out-of-band signaling) to be used to control which Ethernet frames are compressed and decompressed on the network.

Compressed Ethernet frames preferably use the same IEEE format as other Ethernet frames so that they are able to be handled by other Ethernet nodes that do not support compression. According to an embodiment of the invention, one or more new Ethernet types (EtherTypes) are used to identify to the network elements that the payload portion of a given Ethernet frame has been compressed by another Ethernet node on the Ethernet network. An EtherType that indicates that the payload has been compressed will occasionally be referred to herein as an "EtherComp" EtherType, although other names may be coined for the new EtherType as well. Using an EtherComp EtherType enables in-band signaling to be used to indicate to Ethernet nodes on the Ethernet network when a particular Ethernet frame carries a compressed payload.

The IEEE provides a registry of EtherType values. Two new EtherType values may be used for Ethernet compression. One suggested EtherType value is 0xEC01, which may be used to indicate when a frame has been inserted ahead of the original EtherType in a new assembled Ethernet frame after compression. Another suggested EtherType value is 0xEC02, which may be used with a subset of original EtherType values. This EtherType is intended to replace the original EtherType when a frame is compressed. To enable the original EtherType to be determined, a subheader is added after the new EtherType to identify which of the subset of original EtherType values was originally associated with the Ethernet frame. The subheader may have a relatively small number of bits, such as four bits, and should have a length smaller than two bytes.

Out of band signaling may be implemented as well, using the Ethernet control plane, to enable particular flows of Ethernet frames to be compressed over a controlled Ethernet link or tunnel. For example, Ethernet OAM may be used to configure that frames over a particular Ethernet link are compressed. As another example, when tunnels are established on an 802.1 Ethernet network, compression may be negotiated as part of the tunnel establishment process. Accordingly, the Ethernet node control plane may determine which classes of Ethernet frames are to be compressed, and may program that information into the data plane by setting appropriate entries in registers in the dataplane.

Data may be compressed before entering the network. For example, an application running on client 16-J may want to send data to an application running on client 16-I. To reduce the size of the data that is transmitted on the network 10, it is well known that client 16-J may compress the data before transmission. This type of compression occurs at the application layer. Because it may be assumed that the size of the data to be compressed is relatively large, this type of compression generally works quite well using standard compression processes since the dictionary describing the compression forms a relatively small part of the overall data set to be transmitted.

The type of compression being addressed in this application is different from application level compression. Specifically, when an application such as an application running on client 16-J has data to send on a network, the application will pass the data (compressed or uncompressed) to other processes running on the client that will format the data to be transmitted on the network. Formatting the data generally includes breaking the data into manageable sized pieces and putting those pieces of data into protocol data units such as Ethernet frames. On an Ethernet network, for example, the data will be put into Ethernet frames for transmission on the network.

Each Ethernet frame is transmitted on its own through the network, although the Ethernet frames often will follow the same path through the network. According to an embodiment of the invention, the Ethernet nodes such as Ethernet node 12-E, 12-G, etc., may compress the data in the payload portion of an Ethernet frame separately from any data transmitted in any other Ethernet frame, using its own compression dictionary. In this manner, the payload of any one Ethernet frame may be individually compressed and, accordingly, individually decompressed at a later point in the network without reference to the payload of other frames being transmitted on the network.

Compression of the payload of an Ethernet frame may happen at any Ethernet node on the network. For example, when the Ethernet frame is first created, the payload of the Ethernet frame may be compressed to reduce the size of the Ethernet frame. Thus, the client 16-J may run an Ethernet compression process to compress the payload of the Ethernet frame before transmitting the Ethernet frame to Ethernet node 12-E. Alternatively, the Ethernet frame may be initially transmitted onto the Ethernet network by the client 16-J with an uncompressed payload, and then compressed at a later time for example by an Ethernet node that is experiencing congestion.

As another example, compression of Ethernet frames may be established as part of establishing tunnels through the Ethernet network. For example, several Ethernet standards such as 802.1ad, 802.1ah, and 802.1Qay enable tunnels to be established on an Ethernet network. Compression may be established as part of establishing tunnels on the network. Accordingly, any Ethernet node on network 10 may perform compression on the Ethernet frames passing through the network. Similarly, any Ethernet node may decompress the Ethernet frames as they are forwarded through the network. With hardware acceleration, data compression may be performed at wire-speed and with little impact on network delay.

When a network element decompresses a compressed Ethernet frame, it also needs to determine the original EtherType value that was associated with the Ethernet Frame before it was compressed. There are two ways to store the original EtherType in the newly assembled Ethernet frame after compression. The first way is normal that the EtherType is attached between the new EtherType and the compressed payload, see FIG. 8. The other way is where the original EtherType is replaced by the new EtherType plus a short subheader which carries a value from which the original EtherType may be identified. Since the subheader has a limited number of bits, the subheader may only be used to identify several common EtherType values.

For example, a compression EtherType may be used only in connection with several commonly used EtherTypes, and a four bit subheader may be used to identify which of the original 16 possible EtherTypes was associated with the frame before the payload was compressed. This embodiment allows fewer types of Ethernet frames to be compressed, but reduces the length of the Ethernet header as compared to an embodiment where both an EtherComp EtherType and the original EtherType fields are included in the Ethernet header.

With hardware-implemented data compression schemes, network delay due to Ethernet Compression is subtle or minimized. However, when a network is operating normally, and network delay is a primary consideration, Ethernet compression can be optional rather than required. However, as the network begins to experience congestion, a node on the network may opt to compress the Ethernet frames to reduce the size of the Ethernet frames being transmitted on the network to reduce congestion on the network. Thus, Ethernet compression may be used all the time, such that every frame is compressed, or may be selectively implemented when the network is experiencing congestion.

Congestion on the network may be determined several ways, for example as set forth in IEEE 802.1Qau or IEEE 802.3ar. According to an embodiment of the invention, the nodes on the network may be aware of Ethernet congestion and perform Ethernet compression only where the network is experiencing congestion. The control plane of the Ethernet node is involved in congestion signaling and, accordingly, can instruct the data plane to perform compression when the network is experiencing congestion. Alternatively, in other embodiments, the nodes may be implemented to always perform Ethernet compression to increase the throughput on a link, for example on a relatively slow network access link.

Ethernet compression includes encoding the payload of an Ethernet frame with a selected compression algorithm to reduce the Ethernet frame size. It also changes the Ethernet frame header to reflect the newly compressed payload, such as by updating the header to include a new EtherType and, if the original frame included a frame length value, to update the frame to include the new frame length value. Since the payload is changing, the new Ethernet frame will have an updated Frame CheckSum (FCS) fields as well.

According to IEEE 802.3, an Ethernet frame carries a payload up to 1500 bytes, which is relatively small from a compression standpoint. Conventional data compression schemes, such as Huffman coding, LZ77 (which is based on a paper published by Lempel and Ziv in 1977), and LZW (which is based on a paper by Lempel, Ziv, Welch) and their implementations such as WinZIP, Gzip and Bzip2, are designed for large datasets. Therefore, although one or more of these compression schemes or a modification thereof may be used, if desired, they often may not work well with small-size Ethernet frames, since the compressed frame size may turn out to be larger than the original frame size if one of these conventional compression processes is used.

Ethernet compression aims to increase the network bandwidth efficiency through compressing data carried by individual Ethernet frames. In co-pending provisional application No. 60/967,410, filed Sep. 4, 2007, entitled "DYNAMIC BIT-STREAM HUFFMAN CODING FOR FAST NETWORK FLOW DATA COMPRESSION," applicant has proposed several compression schemes based on bit-stream encoding and dynamic symbols, which are lossless, adaptive to small and large data sources, and can compress small data sets such as Ethernet frames quickly, safely and efficiently. The content of this provisional application is hereby incorporated herein by reference. The disclosed frame format may use one of these compression processes, although other compression algorithms may be used as well and are likely to be developed over time.

Ethernet compression employs bit-stream encoding and dynamic symbol selecting technologies which allow even a small amount of data, such as the amount of data typically contained in an Ethernet frame, to be compressed efficiently and safely. Optionally, the size of the compressed Ethernet frame may be compared with the original size of the original Ethernet frame, and if the compression does not reduce the size of the Ethernet frame, or does not reduce the size sufficiently to warrant the additional processing, the original Ethernet frame may be transmitted instead of the compressed Ethernet frame.

An example process that may be used to perform Ethernet compression is shown in FIG. 3, and an example process that may be used to implement Ethernet decompression is shown in FIG. 4. Compression of an Ethernet frame, and decompression of the Ethernet frame, may happen on opposite sides of the network, on opposite sides of a network tunnel, on opposite sides of a link, or ingress/egress interfaces on a given network element. For example, a network element may compress a frame as it is received to reduce the size of the frame that is required to be handled by the network element, and then may decompress the frame prior to transmitting the frame on an egress interface. The compression/decompression process may therefore be utilized in many different contexts.

One example of a compression process is shown in FIG. 3. As shown in FIG. 3, when an Ethernet frame is received at ingress (300), the compress state register 27 will be checked 302 to determine if Ethernet compression has been enabled (306). Depending on whether compression is being implemented at RX (incoming from network) or at TX (outgoing to network), the ingress may involve reception of the frame from a physical Ethernet port or from the switch fabric.

The network element may be involved in network signaling such as Ethernet OAM signaling associated with the establishment of tunnels on the network. As part of this signaling, the ingress and egress Ethernet nodes may agree to use Ethernet compression on frames to be passed over the network tunnel. The control plane may program this into the data plane by setting the appropriate value in the state register 27 to cause frames that are required to pass over the tunnel to also be compressed for transmission on the tunnel.

When the Ethernet frame is received (300), the data plane may check to see if the control plane has indicated that the frame should be compressed. Similarly, the control plane may receive an indication that the Ethernet network is experiencing congestion. The congestion check may be based on IEEE 802.1Qau, IEEE 802.3ar, or using another method. The control plane may program the data plane to compress Ethernet frames under periods of network congestion. Thus, when the data plane receives the frame, it may check the state register 27 to see whether the all Ethernet frames are to be compressed or whether the Ethernet frame belongs to a flow that has been indicated as to be compressed.

The data plane will determine whether compression is enabled for the Ethernet frame (306). If not, the Ethernet node will use the original Ethernet frame (308) and not compress the Ethernet frame. If the data plane determines that it should compress the Ethernet frame, the data plane will check the Ethernet frame to determine if it is already compressed (310). For example, the Ethernet node may check the EtherType to determine if the EtherType indicates that the payload is already compressed. Yet additionally, the Ethernet node may check to see if the size of the Ethernet frame is set to the Maximum Transmission Unit (MTU). If the Ethernet frame has a frame size set to the MTU, it may be assumed that the frame has not been compressed. These checks (310) may be performed in any order.

If the Ethernet frame is already compressed, the Ethernet node will transmit the original Ethernet frame (308). Otherwise, the Ethernet node will compress the payload (312). Since the goal of compression is to reduce the size of the Ethernet frame, the Ethernet node may compare the size of the original payload with the size of the compressed payload (314). If the payload is the same size or larger, the Ethernet frame is not compressible and the Ethernet node may transmit the original Ethernet frame. Optionally, if the Ethernet frame is not compressible, the Ethernet node may set a flag in the Ethernet frame to indicate that the payload is not compressible so that other nodes don't also attempt to compress the Ethernet frame.

If the compression process is successful, and the payload is smaller, the Ethernet node will form a new frame (316) to be transmitted on the network. The new frame will have a new length, an EtherType indicating that the payload is compressed or a compression header in the payload, the compressed payload, and a new Frame CheckSum (FCS). The Ethernet node with then transmit either the original Ethernet frame or the newly formed Ethernet frame (318) from at an Egress. Depending on whether compression is being implemented at RX (incoming from network) or at TX (outgoing to network), the egress may involve transmission to the switch fabric or to a physical Ethernet port. Of course, the Ethernet node may also perform other standard forwarding operations on the Ethernet frame. The flow chart shown in FIG. 3 is merely intended to show the process taken by the Ethernet node in the data plane when determining how to handle compression; other standard processes may proceed in parallel with the compression process, precede it or ensue thereafter as would be understood by a person of ordinary skill in the art.

An example decompression process is depicted in FIG. 4. As shown in FIG. 4, at the ingress, when an Ethernet frame is received (402), the data plane will check the decompress state registers 37 (404) to determine whether it has been instructed by the control plane to decompress all Ethernet frames or an Ethernet flow to which the received Ethernet frame belongs. As with compression, depending on whether decompression is being implemented at RX (incoming from network) or at TX (outgoing to network), the ingress may involve reception of the frame from a physical Ethernet port or from the switch fabric.

The control plane may signal the data plane to decompress Ethernet frames when the state of the network is not congested. Similarly, the data plane may need to decode frames that are intended to be transmitted from the Ethernet node to a client node. Additionally, the Ethernet node may be on the end of a tunnel that has been signaled using OAM signaling or another control plane signaling process. In any of these instances, the control plane may instruct the data plane to decompress any compressed frames that are received on the tunnel by setting the state in the decompress registers 37.

If decompress is not enabled, the Ethernet node will use the original Ethernet frame 410. If decompress is enabled (405), the data plane will check the header (406) to determine whether the Ethernet frame is compressed (408). As mentioned above, where in-band indication of decompression is carried by the Ethernet Frame, the Ethernet frame will contain an EtherComp EtherType that will indicate whether or not the Ethernet frame has been previously compressed. The Ethernet node may look for this EtherType to determine whether the frame indicates that it has not been previously compressed. Where out-of-band signaling is being used, this step may be omitted. If the frame has not been compressed, the Ethernet node will use the original Ethernet frame (410). If the frame is compressed, the Ethernet node will decode the payload (412) and restore the other aspects of the original frame (414). The Ethernet node will then transmit the Ethernet frame (416) from the Egress. Depending on whether decompression is being implemented at RX (incoming from network) or at TX (outgoing to network), the Egress may involve transmission to the switch fabric or to a physical Ethernet port.

As mentioned above, the Ethernet node will need to make sure that the original EtherType of the original frame is available after the frame is decompressed. Where the frame carries the original EtherType, this process is straightforward. Where the EtherComp EtherType has replaced the original EtherType and a sub-header has been appended, the data plane will replace the EtherComp EtherType with the EtherType identified by the bits of the sub-header. In this embodiment the data plane will identify the original EtherType of the frame and insert the original EtherType into the frame header. The decompressing node will also calculate the new length and re-calculate the FCS for the decompressed frame. Both of these values will be restored to the frame to enable the original frame to be restored (414). The Ethernet node will then transmit the Ethernet frame (416) from an Egress Ethernet port.

Figure 5:
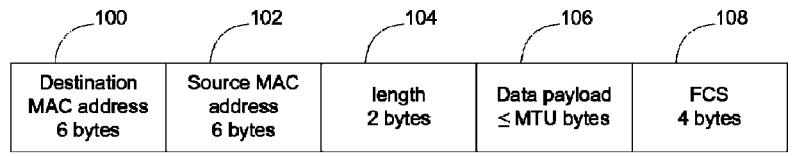
FIG. 5 is a functional block diagram of an Ethernet frame implemented using the current IEEE 802.3 Ethernet standard.

FIG. 5 depicts an Ethernet frame format 100, according to IEEE 802.3. An Ethernet frame generally has a preamble that is 7 bytes long and a one byte delimiter which precedes the fields of the Ethernet frame shown in FIG. 5. As shown in FIG. 5, a standard Ethernet frame has a six byte destination MAC address (DA) 100, a 6 byte source MAC address (SA) 102, and a two byte length field 104. The Ethernet frame also includes a data payload 106 that is up to the maximum transmission unit in length, and a Frame Check Sequence 108.

Figure 6:
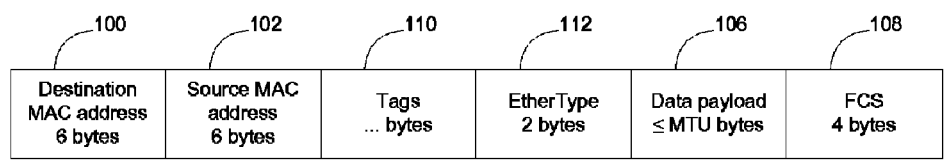
FIG. 6 is a functional block diagram of an Ethernet frame implemented using the current IEEE 802.1 Ethernet standard.

FIG. 6 depicts the 802.1 frame format. As shown in FIG. 6, the 802.1 general frame format is similar in many respects to the 802.3 frame format. However, several extensions to the 802.1 standard have added additional fields, such as tags 110, which may span several bytes depending on the particular standard being implemented on the Ethernet network. Additionally, the frame includes an EtherType field 112 that allows the frame to specify the type of protocol data unit being carried by the Ethernet frame. Numerous standards have added additional fields to the standard Ethernet header and the invention is not limited to the particular type/version of Ethernet being implemented as compression may work with many different versions of Ethernet. The 802.1 Ethernet frame has a data payload field 106 that may range between 46 and 1500 bytes. The Ethernet standard also provides that the final four bytes of the Ethernet frame should be used to implement a Frame Check Sequence (FCS) 108. The data payload is the major part of an Ethernet frame, sizing from 46 to 1500 bytes. Data compression on the payload can condense its data and therefore reduce the size of the Ethernet frame.

Figure 7:
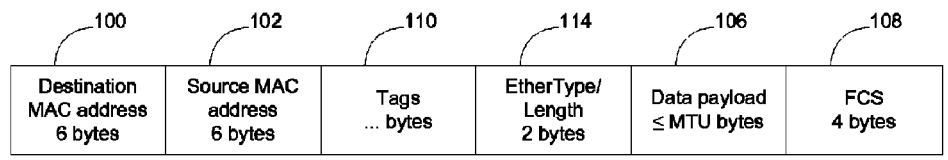
FIG. 7 is a functional block diagram of an Ethernet frame implemented using both 802.1 and 802.3.

FIG. 7 depicts a combined 802.1 and 802.3 frame format. As shown in FIG. 7, the combined frame format is similar to the 802.1 frame format, except that EtherType 112 has been replaced by EtherType/length field 114. Any of the frame formats shown in FIGS. 5-7 may be used to implement Ethernet compression where out-of-band signaling is used by the control plane to establish which frames are to be compressed by the data plane, and which frames are to be decompressed by the data plane.

Figure 8:
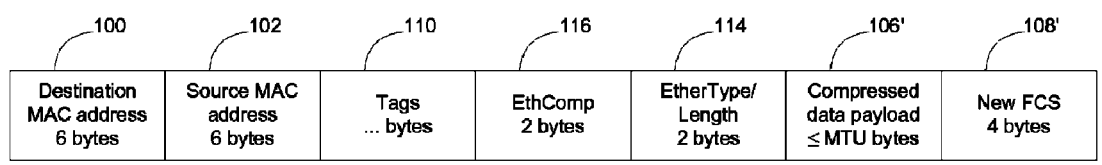
FIG. 8 is a functional block diagram of an example Ethernet frame showing the use of a new EtherType to indicate that the Ethernet frame is compressed.

FIG. 8 illustrates an embodiment of an Ethernet frame which may be used to indicate to the data plane that the Ethernet frame has been compressed or has not been compressed. As shown in FIG. 8, the format of the Ethernet frame is substantially the same as the frame format shown in FIG. 7, in that the Ethernet frame includes a DA 100, and SA 102, tags 110, and original EtherType 114. In addition, a new EtherType, 116, which may be assigned 0xEC01 for example or another value assigned by the IEEE, has been added to enable the frame to be identified by the control plane as compressed. Optionally, the EtherComp EtherType may also convey to the data plane the type of compression that was used.

In FIG. 8, it has been assumed that the Ethernet frame is compressed. Accordingly, the original payload has been replaced with a compressed payload 106'. Additionally, since the content of the frame has changed, a new FCS 108' has been calculated for the frame and appended to the payload.

Figure 9:
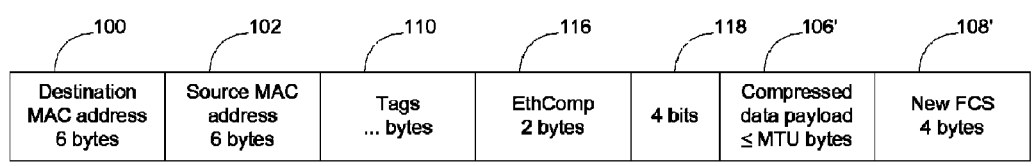
FIG. 9 is a functional block diagram of an example Ethernet frame showing the use of a new EtherType along with a subheader to indicate that the Ethernet frame is compressed.

FIG. 9 shows another embodiment in which the a new EtherType, 116, which may be assigned 0xEC02 for example or another value assigned by the IEEE, has replaced the original EtherType and a small subheader 118 has been added to the frame to enable the Ethernet nodes on the network to determine the EtherType of the original frame. Otherwise, the format shown in FIG. 9 is the same as that shown in FIG. 8.

The small sub-header may be, for example, a four bit field, although other numbers of bits may be used as well. Since the sub-header uniquely identifies only a small range of original EtherTypes, the use of a subheader limits the types of Ethernet frames that may be compressed. Where the sub-header is four bits long, for example, only sixteen original EtherTypes may be identified using the sub-header. However, replacing the original EtherType with the EtherComp EtherType and a small sub-header enables the length header to be reduced by a number of bits.

The IEEE 802 Ethernet Registrar provides (at a cost) the registry of an EtherType assignment, which represents a new type of Ethernet payload with or without a new network protocol. Currently there are thousands of EtherType assignments registered at the IEEE Registrar, for different networking protocols. But most of them are rarely used. Some common EtherType assignments are IPv4(0x8000), ARP (0x0806), DARP(0x8035), IPv6(0x86DD), PPP(0x880B), GSMP(0x880C), and MPLS(0x8847~8848).

For example, assume that a four bit subheader 118 was used to identify the original EtherType of a compressed frame, and that the four bit code for an Ethernet frame carrying IPv4 was 0100. From reading the EtherComp EtherType 116, the receiving node will know that the frame contains a compressed payload. By setting the first four bits of the sub-header 118 to be 0100, the egress network element may determine that the original frame was an IPv4 frame. Although the flags were described as being part of the payload, in an alternative embodiment they may be included in a flag field in the header of the Ethernet frame.

The functions described herein may be implemented as a set of program instructions that are stored in a computer readable memory such as memory 42 and executed on one or more processors such as processor 32 on a computer platform associated with a network element such as the network element shown in FIG. 2. However, it will be apparent to a skilled artisan that all logic described herein can be embodied using discrete components, integrated circuitry such as an Application Specific Integrated Circuit (ASIC), programmable logic used in conjunction with a programmable logic device such as a Field Programmable Gate Array (FPGA) or microprocessor, a state machine, or any other device including any combination thereof. Such programmable hardware implementations may be implemented as part of one or more of the cards 22, 24 forming the data plane of the network element 12 or may be implemented in another manner. Programmable logic can be fixed temporarily or permanently in a tangible medium such as a read-only memory chip, a computer memory, a disk, or other storage medium.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method of compressing data at an Ethernet node, the method comprising:
    obtaining, by the Ethernet node, an original Ethernet frame, the original Ethernet frame having an original Ethernet header, an original payload portion, and an original Frame Check Sequence (FCS);
    compressing, by the Ethernet node, the original payload portion to form a compressed payload portion, compressing the original payload portion comprising encoding the original payload portion of the original Ethernet frame with a selected compression algorithm to reduce the original Ethernet frame size, the compressing being implemented by the Ethernet node to compress the original payload portion of the original Ethernet frame separately from any data transmitted in any other Ethernet frame using a compression dictionary; and
    creating, by the Ethernet node, a new Ethernet frame including a new Ethernet header, the compressed payload portion, a new FCS, and the compression dictionary, the compression dictionary being created for and transmitted with the new Ethernet frame and being only used for the original Ethernet frame and for no other Ethernet frame.

2. The method of claim 1, wherein the original Ethernet header contains an original frame length value, and wherein the new Ethernet header has a new frame length value smaller than the original frame length value.

3. The method of claim 1, further comprising checking, by the Ethernet node, a length of the compressed payload portion after the step of compressing, and wherein the Ethernet node does not perform the step of creating the new Ethernet frame if the length of the compressed payload portion is larger than a length of the original payload portion.

4. The method of claim 1, wherein the original Ethernet header contains an original EtherType value, and wherein the new Ethernet header contains an indication of the original EtherType value.

5. The method of claim 4, wherein the indication of the original EtherType value is the original EtherType value, the original EtherType value being positioned in the new Ethernet frame directly after a new EtherType value.

6. The method of claim 4, wherein the indication of the original EtherType value is a subheader containing a bit field uniquely identifying the original EtherType value.

7. The method of claim 1, wherein the original Ethernet header contains an original EtherType value, and wherein the new Ethernet header has a new EtherType value that replaces the original EtherType value.

8. The method of claim 1, further comprising participating, by the Ethernet node, in out of band signaling with other Ethernet nodes on a network to determine whether the original Ethernet frame should be compressed, and wherein the Ethernet node only performs compressing the original payload portion and creating a new Ethernet frame where the out-of-band signaling indicates that the Ethernet frame should be compressed.

9. The method of claim 1, further comprising determining, by the Ethernet node, whether a network is experiencing congestion, and wherein the Ethernet node only performs compressing the original payload portion and creating a new Ethernet frame where the network is experiencing congestion.

10. The method of claim 1, further comprising determining, by the Ethernet node, whether the original Ethernet frame is compressed, and wherein the Ethernet node does not perform compressing the original payload portion and creating a new Ethernet frame where the original Ethernet frame is already compressed.

11. A method of reducing congestion on an Ethernet network, the method comprising:
    sensing congestion on the Ethernet network by an Ethernet node on the Ethernet network;
    receiving an original Ethernet frame by the Ethernet node on the Ethernet network;
    determining if the original Ethernet frame is compressed; and
    compressing a payload portion of the original Ethernet frame in a self-contained manner such that the compressed payload portion of the original Ethernet frame is decompressed at a later time without reference to any other Ethernet frame on the Ethernet network, compressing comprising encoding the payload portion of the original Ethernet frame with a selected compression algorithm and resulting in creation of a new compressed version of the original Ethernet frame, the new compressed version of the original Ethernet frame having a smaller length than the original Ethernet frame, the compressing being implemented by the Ethernet node to compress the payload portion of the original Ethernet frame separately from any data transmitted in any other Ethernet frame using a compression dictionary that is created for and transmitted with the new compressed version of the original Ethernet frame and that is only used for the original Ethernet frame and for no other Ethernet frame; and
    transmitting the new compressed version of the original Ethernet frame on the Ethernet network.

12. An Ethernet network, comprising:
    a plurality of Ethernet nodes interconnected by links, at least one of the Ethernet nodes being configured to decompress Ethernet frames that have been individually compressed using an encoding algorithm to reduce a payload size of the Ethernet frames prior to transmission over the links of the Ethernet network; wherein the at least one of the Ethernet nodes decompresses the Ethernet frames using a decoding algorithm corresponding to the encoding algorithm, the encoding algorithm and decoding algorithm operating on a payload portion of the Ethernet frames, wherein the at least one of the Ethernet nodes decompresses each of the Ethernet frames separately from any data transmitted in any other Ethernet frame, wherein each Ethernet frame is decompressed using a separate decompression dictionary that is created for and transmitted with that Ethernet frame and that is only used for that Ethernet frame and not used for any other Ethernet frame, such that each Ethernet frame is decompressed using its own unique decompression dictionary.

13. The Ethernet network of claim 12, wherein the at least one of the Ethernet nodes that are configured to decompress Ethernet frames are implemented to perform a decompression process on each individual Ethernet frame, the decompression process including the steps of decompressing a payload portion of an Ethernet frame that is to be decompressed, and restoring an original EtherType value to the Ethernet frame that is to be decompressed.

14. The Ethernet network of claim 13, wherein the original EtherType value is determined from a subheader containing a bit string uniquely identifying the original EtherType value as one of a small subset of possible EtherType values.

15. The Ethernet network of claim 12, wherein the plurality of Ethernet nodes participate in Ethernet Operation, Administration, and Maintenance (OAM) signaling to collectively specify which Ethernet frames are to be compressed and decompressed.

* * * * *